United States Patent [19]

Akamatsu

[11] 4,107,552
[45] Aug. 15, 1978

[54] SEMICONDUCTOR SWITCH

[75] Inventor: Masahiko Akamatsu, Amagasaki, Japan

[73] Assignee: Mitsubishi Denki Kabushiki Kaisha, Tokyo, Japan

[21] Appl. No.: 743,671

[22] Filed: Nov. 22, 1976

[30] Foreign Application Priority Data

Jan. 12, 1976 [JP] Japan .................................. 51-2574

[51] Int. Cl.² ........................................... H03K 17/72
[52] U.S. Cl. ............................ 307/252 J; 307/252 C; 307/252 M; 307/305
[58] Field of Search ............ 307/252 C, 252 D, 252 J, 307/252 N, 252 M, 305

[56] References Cited

U.S. PATENT DOCUMENTS 3,619,652 11/1971 Ogle .................................. 307/305 X
3,928,775 12/1975 Steigerwald .................... 307/252 M Primary Examiner—John Zazworsky
Attorney, Agent, or Firm—Oblon, Fisher, Spivak, McClelland & Maier

[57] ABSTRACT

A semiconductor switch comprising a transistor connected to a main circuit having a DC current and a load; pulsing means which is connected in series in an electric path connecting the collector and the emitter of the transistor; and a thyristor having main current electrodes connected in parallel to the series combination of the transistor and the pulsing means.

6 Claims, 10 Drawing Figures

FIG. 1
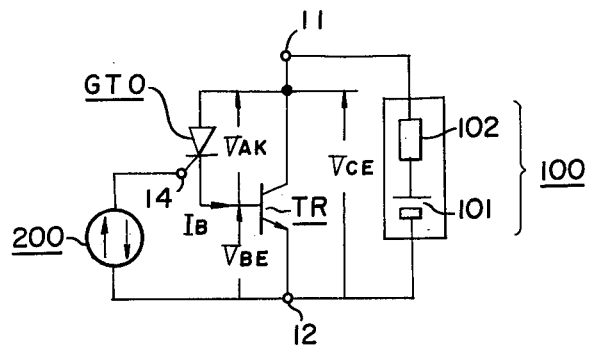
FIG. 2
(a)
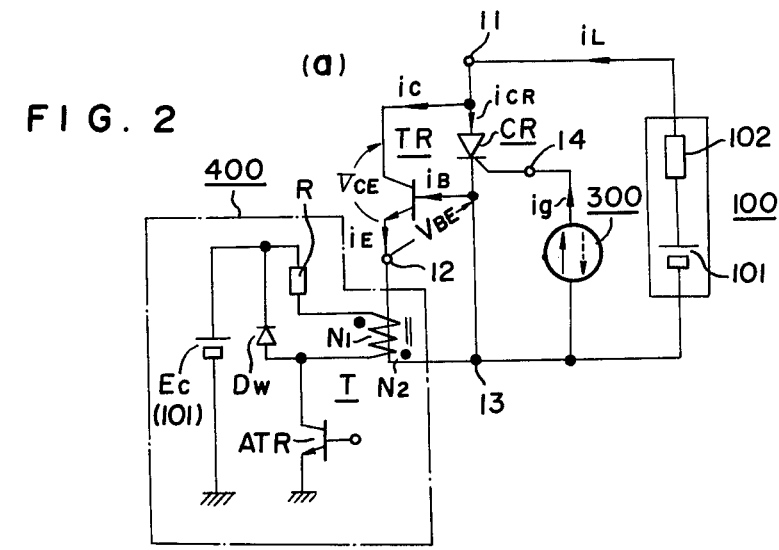
(b)　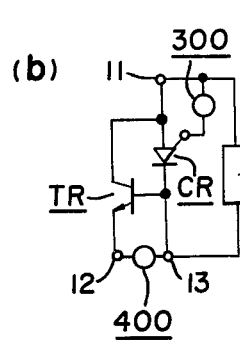　(c)　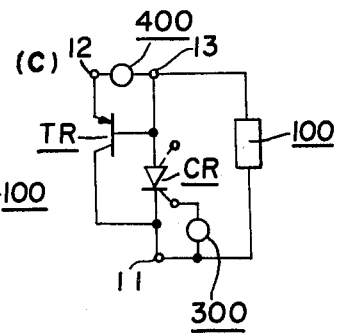

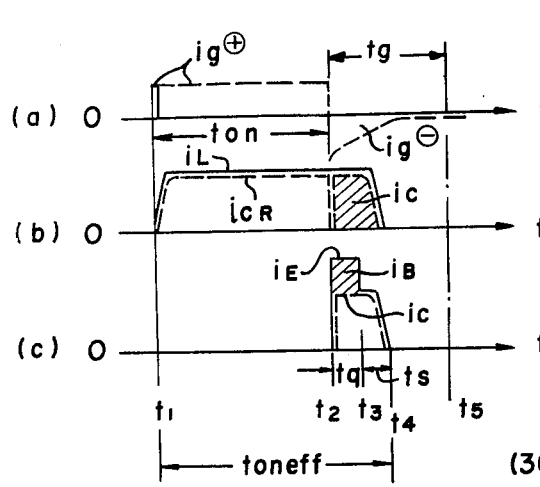
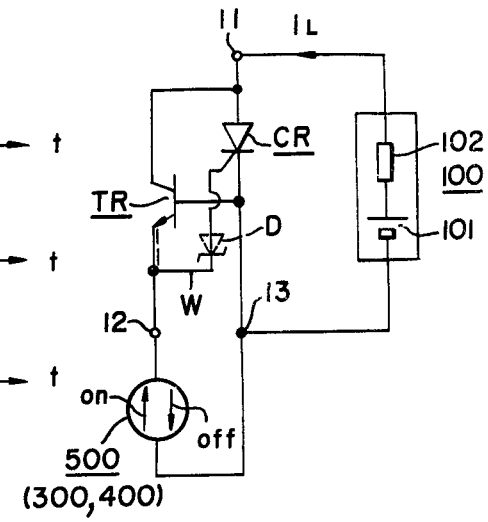
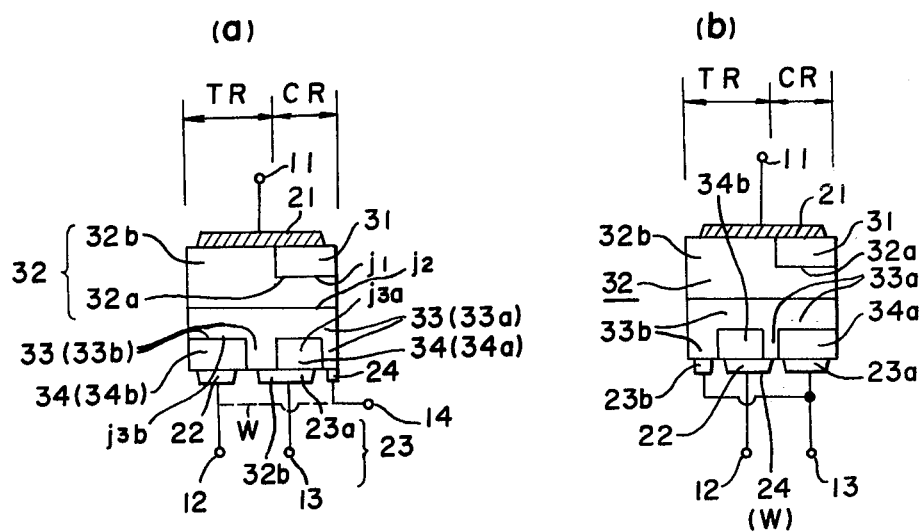

SEMICONDUCTOR SWITCH

BACKGROUND OF THE INVENTION

The present invention relates to a self turn-off type semiconductor switch in which pulsing means is connected in series between the collector and emitter of a transistor TR and the series combination of the pulsing means and the transistor is connected in parallel between the main current electrodes of a thyristor CR, thereby moderating the characteristic condition of the transistor TR; and the collector of the transistor is connected in common potential to the reverse gate side main current electrode of the thyristor thereby easily using controlling means in common and easily using one case for packing the semiconductors and easily applying high voltage in large current.

It has been difficult to obtain a high voltage large current device from a transistor switch because it is difficult to attain the feeding of the base current, and the control for a large current device. A thyristor should have a complicated forced commutating means.

It has been difficult to obtain a large power device from a gate turn-off thyristor because the turn-off switch power is locally applied. Accordingly, it has a smaller capacity than that of the transistor.

Referring to FIG. 1, the conventional transistor switch will be illustrated.

In the conventional transistor switch, a gate turn-off type thyristor GTO is connected between the collector and base of the transistor TR. The transistor TR is turned on and off depending upon the gate turn-off type thyristor GTO. That is, the current amplification of the output of the thyristor GTO is controlled by the transistor TR.

Accordingly, the maximum power is dependent upon the transistor TR and the maximum power cannot be increased compared with that of the transistor. On the contrary, the controllable base current is limited by the thyristor GTO and accordingly, the power level is lower than that of the transistor switch having the other base controlling means.

It is necessary to increase the current amplification KFE of the transistor for decreasing the turn-off current of the thyristor GTO. Accordingly, the breakdown voltage is decreased or the current density per unit area of the semiconductor wafer is decreased.

In the conventional semiconductor switch of FIG. 1, the sum of the base voltage drop VBE of the transistor TR and the voltage drop VBE of the transistor TR and the voltage drop VAK of the gate turn-off thyristor GTO is the collector voltage VCE of the transistor. Accordingly, the voltage drop is high and the loss is large.

Moreover, the turn-off of the transistor TR immediately proceeds at the time of the turn-off of the thyristor GTO. Accordingly, the turn-off of the thyristor by the gate is not substantially improved for the thyristor, and it is dependent upon only the current amplification of the transistor.

SUMMARY OF THE INVENTION

It is an object of the present invention to provide an improved semiconductor switch in which the turn-off of a thyristor is easily attained and the controlling means can be commonly used and high voltage can be applied in large current.

The semiconductor switch comprises a transistor connected in a main circuit having a DC current source and a load; the pulsing means which is connected in series in an electric path connecting the collector and the emitter of the transistor; and a thyristor having main current electrodes connected in parallel to the series combination of the transistor and the pulsing means.

BRIEF DESCRIPTION OF THE DRAWINGS

Various objects, features and attendant advantages of the present invention will be more fully appreciated as the same is better understood from the following detailed description of the present invention when considered in connection with the accompanying drawings in which:

FIG. 1 is a circuit diagram of a conventional semiconductor switch;

FIG. 2 (a) to (c) are circuit diagrams of embodiments of the semiconductor switch in accordance with the invention;

FIG. 3 is a waveform for illustrating the operation;

FIG. 4 is a circuit diagram of the another embodiment of the semiconductor switch in accordance with the invention;

FIG. 5(a), (b) are respectively sectional views of the structures of embodiments of suitable semiconductors used in the switch of the invention;

DETAILED DESCRIPTION OF THE PREFERRED EMBODIMENT

Figure 6:
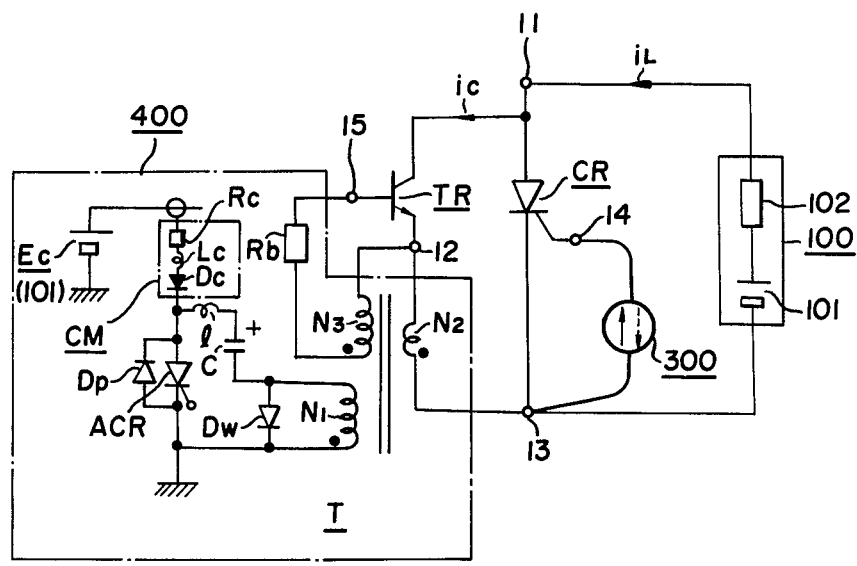
FIG. 6 is a circuit diagram of the another embodiment of the semiconductor switch in accordance with the invention.

Referring to the drawings wherein like reference numerals designate identical or corresponding parts through the several views and more particularly to FIG. 2 thereof, FIG. 2(a) is a circuit diagram of one embodiment of the power semiconductor switch in accordance with the invention.

A main power circuit 100 comprises a power source 101 and a load 102, and a thyristor CR is connected to the main power circuit 100. A collector and a base of a transistor TR are respectively connected to the main current electrodes (anode and cathode) of the thyristor CR. The gate of the thyristor is connected to the gate controlling means 300 and the pulse controlling means 400 is connected between the emitter and the base of the transistor. The controlling means 400 is for example, a pulse generator which consists of a transformer T, an auxiliary transistor ATR, a current limiting resistor R, a diode Dw and an auxiliary power source Ec.

The transformer T can be a one-turn through type current transformer for secondary winding $N_2$ (pulse current transformer etc.) or several-turn through type current transformer (pulse current transformer) or a pulse voltage transformer. The power source 101 of the main power circuit can be commonly used as the auxiliary power source Ec. The controlling means 400 can also have both the function of feeding a DC control power in the normal state and the pulse generating function.

FIG. 3 is a waveform illustrating the operation of the embodiment of FIG. 2 (a).

The gate controlling means 300 of the thyristor CR feeds the forward gate current +ig at the time of turning on or during the ON period t on and feeds the reverse gate current $-i_g$ or the reverse bias voltage (FIG. 2(a) the dotted arrow line) during the time period $t_g$ for turning off the thyristor CR or during the OFF period. The waveform is shown in FIG. 3 (a).

The controlling means 400 feeds the forward pulse current (or voltage) between the emitter and the base of the transistor TR at time $t_q$ for turning off the thyristor CR. The controlling means 400 also applies the reverse bias pulse voltage (or current) at the time $t_3$ to $t_5$ in the OFF state of the transistor TR whereby the turn-off speed of the transistor TR itself can be improved. The reverse bias of the transistor TR is maintained after the OFF period $t_4$ of the transistor whereby the breakdown of the transistor TR itself is prevented. The specific forward bias current (or voltage) is fed during the ON period $t_{on}$ of the transistor TR whereby a part of the main current $iL$ is shunted to the transistor TR during the ON period of the transistor TR.

The controlling means 400 of the embodiment surrounded by the dotted line in FIG. 2(a), is one embodiment which feeds the forward pulse current during the time $t_q$ in the OFF period of the transistor TR and applies the reverse bias voltage (self bias) during the time $t_3$ to $t_4$ in the OFF period of the transistor TR.

FIG. 3(c) is a waveform of the output current $iE$ of the controlling means 400 of the pulse system.

The thyristor CR which is turned on by the forward gate current $+ig$ passes the main current $iL$ during the ON period of the thyristor CR.

The waveform is shown by the dotted line $iCR$ in FIG. 3 (b).

The controlling means 400 feeds the sum of the main current $iL$ and a desired base current $iB$ of $iE = iL + iB$ during the time $t_q$ for turning off the thyristor CR, whereby the collector current $iC$ reaches to the main current $iL$ to decrease the collector voltage VCE.

On the other hand, when the base current $iB$ is large enough, the base voltage VBE is higher than the collector voltage VCE. (VBE $\geq$ VCE).

The potential at the emitter terminal 12 is varied for varying VBE from the potential of the common terminal 13 for the base and the cathode. The potential difference acts to forward direction to the transistor TR and acts to reverse bias to the thyristor CR. That is, the voltage VCR = VCE−VEE $\leq$ O is applied between the main electrodes of the thyristor CR. The negative value means reverse bias.

Thus, the thyristor CR is turned off. During the OFF period $t_q$ of the thyristor CR, the main current $iL$ is fed to the transistor TR. The waveform of the collector current $iC$ is shown by the shading part $iC$ of FIG. 3 (b) and the dotted line $iC$ of FIG. 3(c).

When the thyristor CR has high gate reverse bias effect {for example, the thyristor having complicated pattern of the gate electrode and the gate side main current electrode (a cathode for a gate thyristor or an anode for N gate type thyristor) or the thyristor having less than 1 mm of the maximum plane shortest distance from the gate electrode boundary to the gate side main current electrode,} the thyristor CR can be turned off by the gate reverse bias by the gate controlling means 300 even though the weak forward voltage VBE < VCE and VCR >O is applied.

In this case, the main current iL is commutated to the collector of the transistor TR depending upon performing the turn-off of the thrystor.

As the reapplied forward voltage of the thyristor CR is controlled to low voltage (VCR = VCE−VBE) by the transistor TR, the turn-off switching power fed into the thyristor CR is quite low thereby imparting the effect for easily turning it off compared with the conventional gate turn-off thyristor GTO.

After the specific turn-off time $t_q$, the feeding of the pulse power from the controlling means 400 is stopped. In the embodiment surrounded by the dotted line in FIG. 2(a), the auxiliary transistor ATR is turned off, whereby the collector current $iC$ is continuously passed during the accumulation time $t_s$ ($t_3$ to $t_4$) of the transistor TR.

During this period, the transistor TR receives the self reverse bias by the output impedance of the controlling means. 400.

In the embodiment surrounded by the dotted line, the voltage drop is caused in a polarity to give negative potential on the mark side of the secondary winding $N_2$ of the transformer T. The voltage is limited by the primary winding loop including the primary winding $N_1$ and the current limiting resistor R. That is, the secondary calculated resistance $(N_2/N_1)R$ and the secondary calculated leakage impedance of the transformer is applied between the emitter and the base of the transistor TR.

Accordingly, the reverse bias is applied between the emitter and the base of the transistor TR whereby the transistor TR is rapidly recovered to shorten the accumulation period $t_s$.

Thus, the voltage drop of the thyristor CR is the total voltage drop during the ON period in the embodiment shown in FIG. 2(a), whereby the voltage drop is small in comparison with that of the conventional circuit of FIG. 1.

By comparison with the thyristor CR itself, the turn-off of the thyristor is easier.

By comparison with the transistor TR itself, it is easy to feed large current pulse for a short time (compared with the conventional transistor TR for continuously feeding), and the pulse base current can be easily a large current. Accordingly, a large current can be fed in the case of the same transistor. It is possible to obtain a high voltage device when the current is the same and the area of the semiconductor wafer is the same.

When the transistor TR is considered as comutating means for the thyristor CR, the transistor is simpler than the auxiliary commutating thyristor, the commutating capacitor and inductance for turning off the thyristor.

Especially, the commutating pulse power has the voltage corresponding to the main power voltage by the conventional turn-off method. On the contrary, in accordance with the invention, it can be the voltage between the base and the emitter of the transistor. Accordingly, the pulse power is remarkably small.

FIG. 2(b) is a circuit diagram of one embodiment of a combination of a NPN type transistor and a P gate type thyristor.

FIG. 2(c) is a circuit diagram of another embodiment of a combination of a PNP type transistor and a thyristor. The P gate type thyristor shown by the full line and the N gate type thyristor shown by the dotted line can be used.

In FIG. 2, the combination of the P gate type thyristor and the NPN type transistor or the combination of the N gate type thyristor and the PNP type transistor can be easily controlled because of low potential difference between the gate side main current electrode of the thyristor and the emitter of the transistor. Moreover, it is especially advantageous for packing the semicanductor wafer of the thyristor and the semiconductor wafer of the transistor in one case. Furthermore, it is effective for forming both the thyristor and the transistor on the same semiconductor. This embodiment will be illustrated below.

FIG. 4 is a circuit diagram of another embodiment of the invention, wherein the reverse gate side main current electrode of the thyristor CR and the collector of the transistor TR are connected at the common potential, and the gate electrode is connected to the emitter electrode.

It is possible to connect a diode or Zener diode D, an impedance or a varistor as shown by the dotted line in series to the gate electrode.

In FIG. 4, the controlling means 500 is connected between the emitter and the base (and the controlling electrode side main current electrode). The controlling means 500 includes the gate controlling means 300 and the pulse controlling means 400.

In the circuit of FIG. 4, when the controlling voltage is applied in reverse to the direction of the base-emitter, the forward gate current is fed to the gate of the thyristor whereby the thyristor CR is turned on.

When the thyristor CR is turned off, the pulse voltage (or the pulse current) is applied in the forward direction between the base and the emitter of the transistor, whereby the thyristor is turned off as the embodiment of FIG. 2.

At the turn-off finish time (FIG. 3 $t_3$ to $t_4$), the polarity of the voltage of the controlling means 500 is reversed to apply the reverse bias between the base-emitter of the transistor, and the forward voltage is applied to the gate of the thyristor CR.

When the voltage is controlled to less than the nonfiring gate voltage, the thyristor is not turned on again.

The gate series element such as the diode, the Zener diode the impedance and the varistor increases the nonfiring voltage to increase the voltage drop at the turn-off finish time which is allowed for the controlling means 500. That is, the erroneous turn-on at the turn-off finish time is prevented.

FIGS. 5 (a), (b) are respectively sectional views of the structures of the semiconductor devices which are suitable for the embodiments of FIGS. 2 and 4. FIG. 5(a) is the combination of the P gate thyristor and the NPN transistor or the combination of the N gate thyristor and the PNP transistor. The gate electrode 14 is lead out.

In FIG. 5 (a), the gate contact 24 can be inwardly connected to the emitter contact 22 by the connecting means W shown by the dotted line.

In FIG. 5 (b), the emitter contact 22 and the gate contact 24 are the common contact W.

In FIGS. 5 (a), (b), the electrode terminals 11, 12, 10, 14 which are lead out of the case respectively correspond to those of the terminals in the circuits of FIGS. 2 and 4.

The first contact 21 is brought into ohmic contact with the first exposed surfaces of the first conductive type first semiconductor layer 32 and the second conductive type second semiconductor layer 31 is the reverse gate side thyristor emitter layer of the thyristor CR.

The part 32b in the region which is brought into ohmic contact with the first contact 21 of the second conductive type first semiconductor layer, is the collector of the transistor TR. The part 32a for forming the first PN junction $J_1$ with the first semiconductor layer 31 is the first base layer (reverse gate side thyrister base layer) of the thyristor CR.

The first conductive type third semiconductor layer 33 includes the base layer 33b of the transistor TR and the second base layer (gate layer) 33a of the thyristor CR, and it forms the second PN junction $J_2$ to the second semiconductor layer 32. The base layer 33b of the transistor TR and the gate layer 33a of the thyristor CR respectively have the exposed surfaces at the second surface and are respectively brought into ohmic contact with the third B contact 23b or the fourth contact 24.

The second conductive type fourth semiconductor layer 34 includes the emitter layer 34b of the transistor TR and the gate side thyristor emitter layer 34a of the thyristor CR.

The fourth semiconductor layer 34 forms the third PN junction $J_3$ with the third semiconductor layer 33. The third PN junction $J_3$ includes the base-emitter junction $J_3b$ of the transistor and the gate emitter junction $J_{3a}$ of the thyristor.

The fourth semiconductor layer 34 has the exposed surface at the second surface, and the emitter layer 34b of the transistor is brought into ohmic contacat with the second contact 22 and the emitter layer 34a of the thyristor is brought into ohmic contact with the third A contact 23a. The third A contact 23a is connected to the third B contact 23b and is lead out to the third electrode 13. The first contact 21 and the second contact 22 are respectively lead out to the first electrode 11 and the second electrode 12.

The fourth contact 24 is lead out to the fourth electrode 14 or is is connected to the second contact 22. When the fourth contact 24 is lead out to the outer electrode 14, it is used for the embodiment shown in FIG. 2. When the fourth contact 24 is connected to the inner contact 22, it is used for the embodiment shown in FIG. 4.

The semiconductor structures shown in FIGS. 5(a), (b) can be formed in one semiconductor wafer or they can be also packed in one case by welding a semiconductor wafer of the thyristor CR and a semiconductor wafer of the transistor TR on one plate (molybdenum plate or copper plate).

This is the remarkable advantage attained by the embodiment for connecting the collector of the transistor and the reverse gate side main current electrode of the thyristor in the common potential.

In the structure of the device of FIG. 5, when the first conductive type semiconductor is the P type semiconductor, the second conductive type semiconductor is the N type semiconductor. When the first conductive type semiconductor is the N type semiconductor, the second conductive type semiconductor is the P type semiconductor.

FIG. 6 is a circuit diagram of another embodiment of the invention. In FIG. 6, the base of the transistor TR is separated from the gate side main current electrode of the thyristor CR and the pulse controlling means 400 is connected in series to the collector-emitter path of the transistor TR. The commutation pulse output terminals {(12) – (13)} and the base pulse output terminals {(15) – (12)} are separately formed. For example, as the circuit surrounded by the chain line, the secondary winding $N_2$ of the transformer is connected in series to the collector-emitter path of the transistor TR and the third winding $N_3$ is connected through the base resistor Rb between the base-emitter of the transistor. The primary winding $N_1$ is connected in series to the capacitor discharging circuit including the inductance I and the capacitor C and the auxiliary thyristor ACR. The capacitor C is charged through the charging means CM (for example, a resistor, an inductance, series of them and series of a commutating device and a resistor or an inductance) from the auxiliary power source Ec during the OFF period of the auxiliary thyristor.

The transformer T converts the current discharged from the capacitor C and the pulse current is shunted through the secondary winding $N_2$ and the third winding $N_3$ to the collector emitter path and the base.

In the resistor for the primary winding $N_1$, the current in the secondary winding $N_2$ is increased depending upon the increase of the main current $iL$, whereby the primary calculated resistance is decreased and the loss factor of the I-C discharge loop through the primary winding is decreased and the discharging current is increased.

Accordingly, the circuit has the characteristic for increasing the pulse generating current depending upon the increase of the main current $iL$.

As stated above, when the base electrode 15 is provided, it is easy to provide various means for improving the adaptabilities of the pulse base control and the control under feeding the pulse power in series to the collector-emitter path of the transistor TR for feeding the main current $iL$ from the thyristor CR.

Figure 7:
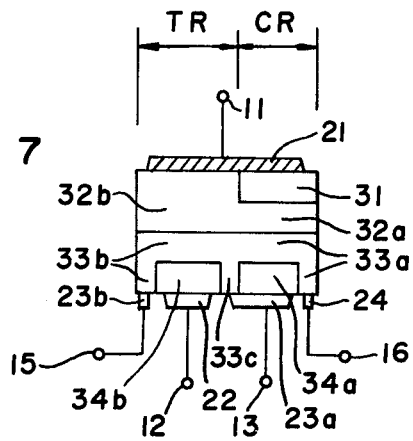
FIG. 7 is a sectional view of the structure of the another embodiment of the semiconductor switch.

FIG. 7 is a sectional view of a semiconductor device which is used in the embodiment using a separated base electrode as the embodiment shown in FIG. 6.

In FIG. 7, the third B contact 23b which is brought into ohmic contact with the base layer 33b of the transistor TR, is lead out as the fifth electrode 15. The third A contact 23a which is brought into ohmic contact with the gate side emitter layer 34a of the thyristor CR, is lead out as the third electrode 13. When the transistor part TR and the thyristor part CR are formed in one wafer, it is possible to expose the third semiconductor layer 33C in the boundary at the second surface to bring it into ohmic contact with the third A contact 23a in order to prevent mutual interference and especially the refiring phenomenon of the thyristor part CR by the current of the transistor part TR at the turn-off time.

The third semiconductor layer 33C has the interference resistance caused by the resistance of the third semiconductor layer 33 between the layer 33c and the base layer 33b whereby the thyristor part CR and the transistor part TR have partially a connection of FIG. 5(a).

The ratio of the connection is dependent upon the ratio of the exposed boundary length between the layer 33c and the layer 34b to the exposed boundary length between the layer 33b and the layer 34b.

In the device for the embodiment of FIG. 6, the latter length should be longer.

When the device of FIG. 7 having a desired ratio of the exposed boundary length is used in the circuit of FIG. 6, various embodiments combining the transistor part connected in the embodiment of FIG. 2 and the transistor part connected in the embodiment of FIG. 6 at a desired ratio, can be provided.

What is claimed as new and desired to be secured by letters patent in the United States is:

1. A semiconductor switch comprising:
   a thyristor having main electrodes and a gate electrode, said main electrodes connected in series to a power path connecting a power source and a load, the current in said power path flowing through said thyristor;
   a transistor having a collector, an emitter and a base, said collector and emitter connected to said main electrodes of said thyristor in parallel with the forward direction thereof;
   a pulsing means for generating a commutating pulse to reverse bias said main electrodes of said thyristor through said collector and emitter of said transistor; and
   wherein said pulsing means is connected in series with said collector and emitter of said transistor.

2. A semiconductor switch according to claim 1 further comprising:
   a gate reverse bias means for reverse biasing said gate electrode of said thyristor.

3. A semiconductor switch according to claim 1 wherein:
   said thyristor and said transistor are packed in one semiconductor device case.

4. A semiconductor switch which comprises:
   a thyristor having main electrodes and a gate electrode, said main electrodes connected in series to a power path connecting a power source and a load, the current in said power path flowing through said thyristor;
   a transistor having a collector, an emitter and a base, said collector and base connected to said main electrodes of said thyristor in parallel with the forward direction thereof;
   a pulsing means for generating a pulse voltage which is applied forwardly between said emitter and base of said transistor for causing said transistor to conduct between said collector and emitter thereof, said pulsing means connected in a series path connecting said emitter and base of said transistor;
   whereby current flowing through said power path is bypassed to said transistor from said thyristor.

5. A semiconductor switch according to claim 4 further comprising:
   a gate reverse bias means for reversely biasing said gate electrode of said thyristor.

6. A semiconductor switch according to claim 4 wherein:
   said gate electrode of said thyristor is connected to said emitter of said transistor.

* * * * *